United States Patent [19]
Nojima

[11] Patent Number: 6,097,636
[45] Date of Patent: Aug. 1, 2000

[54] WORD LINE AND SOURCE LINE DRIVER CIRCUITRIES

[75] Inventor: Isao Nojima, Los Altos, Calif.

[73] Assignee: Silicon Storage Technology, Inc., Sunnyvale, Calif.

[21] Appl. No.: 09/390,060

[22] Filed: Sep. 3, 1999

[51] Int. Cl.[7] .............................. G11C 16/06; G11C 8/00
[52] U.S. Cl. .............................. 365/185.23; 365/185.05; 365/230.06
[58] Field of Search .................... 365/185.05, 185.23, 365/230.06

[56] References Cited

U.S. PATENT DOCUMENTS

| | | | |
|---|---|---|---|
| 4,617,652 | 10/1986 | Simko | 365/185.23 |
| 5,544,117 | 8/1996 | Nakayama et al. | 365/185.11 |
| 5,910,913 | 6/1999 | Kato et al. | 365/185.11 |

*Primary Examiner*—Trong Phan
*Attorney, Agent, or Firm*—Ronald L. Yin; Limbach & Limbach LLP

[57] ABSTRACT

A word line and source line decoder driver circuit has at least one word line, at least one source line, a row decoder driver circuit displaced at a first side of a memory array and a high voltage circuit displaced at an opposite side of the memory array. The word line is connected to the row decoder driver and extends substantially from the row decoder driver circuit in the direction of the high voltage circuit. The source line is connected to the high voltage circuit and extends substantially from the high voltage circuit in the direction of the row decoder driver circuit, but is not connected thereto. Alternatively, a word line decoder driver circuit has a row decoder driver circuit displaced at a first side of a memory array, a high voltage circuit displaced at a second side, opposite said first side, of the memory array. At least one word line is connected to the row decoder driver circuit and the high voltage circuit. At least one source line is connected to the high voltage circuit and extends in the direction of the row decoder driver circuit, but is not connected thereto. A blocking transistor, in each word line, is configured to prevent a high voltage from reaching said row decoder driver circuit.

20 Claims, 5 Drawing Sheets

WORD LINE AND SOURCE LINE DRIVER CIRCUITRIES

TECHNICAL FIELD OF THE INVENTION

The present invention relates to word line and source line driver circuitries for non-volatile memories.

BACKGROUND OF THE INVENTION

Generally, a semiconductor memory device such as a dynamic random access memory (DRAM) comprises a cell array block for storing data. The cell array block includes word lines and bit lines interconnected in the form of a net and a plurality of cells connected to the bit lines and word lines.

A row decoder is adapted to select a desired one of the word lines in the cell array block. Namely, the row decoder selects one of the word lines in the cell array block corresponding to an input row address. Memory array devices, such as static random access memory (SRAM) or read-only memory (ROM) devices, require row and column address decoders to access the desired digital information of the memory array.

Memory line decoder drivers allow for driving of associated rows or columns of a memory array, on the basis of a selection signal and address signals by which the associated row or column address is coded.

In high capacity semiconductor memory devices, such as dynamic random access memories (DRAMs), which utilize a low voltage power supply, it has been necessary to utilize word line driver circuits which internally boost the power supply voltage for driving the word lines above that of the low voltage power supply. Such a word line driver circuit is depicted in FIG. 1.

With reference now to FIG. 1, the operation of the conventional word decoder driver circuit 1 will now be explained. A row decoding signal $X_D$ generated by a row decoder (not shown), is applied through an NMOS transfer transistor 2, to the gate of a pull-up NMOS transistor 3. The gate terminal of the transfer transistor 2 is connected to a power supply voltage $V_{CC}$. When the row decoding signal $X_D$ is HIGH, the pull-up transistor 3 is turned ON, and pull-down NMOS transistor 4 is turned OFF by the inverted row decoding signal $X_D$, thereby transferring the word line drive signal $\phi X_1$ to a word line WL of the semiconductor memory device.

In a flash memory array of the type using a non-volatile memory cell disclosed in U.S. Pat. No. 5,242,848, which is incorporated herein by reference, the control gate of the memory cell is connected to the word line, while one of the other terminals is connected to a source line. The source line is parallel to the word line in the array. Further, during programming of the cells in the memory array, the word line (control gate of the cell) must be held at a low voltage (such as 1.8V) while the source line (source of the cell) is held at a high voltage (such as 11V). During an erase operation, the word line (control gate of the cell) must be held at a high voltage (such as 12V) and the source line (source of the cell) is held at low voltage (such as 0V). Thus, a row decoder must be able to supply high voltage for erase and low voltages for fast reading.

Due to dual high and low voltage requirements, it is very difficult to optimize word line driver circuits.

Thus, it is desirable to provide a row decoder circuit that separates the high voltage operating transistors from the low voltage operating transistors to prevent or limit these occurrences.

SUMMARY OF THE INVENTION

A word line and source line decoder driver circuit has at least one word line, at least one source line, a row decoder driver circuit displaced at a first side of a memory array and a high voltage circuit displaced at an opposite side of the memory array. At least one word line is connected to the row decoder driver circuit and extends substantially from the row decoder driver circuit in the direction of the high voltage circuit. At least one source line is connected to the high voltage circuit and extends substantially from the high voltage circuit in the direction of the row decoder driver circuit but is not connected thereto. The row decoder driver circuit has a switch for connecting the row decoder driver circuit to a source of high voltage and to a source of low voltage.

Alternatively, a word line decoder driver circuit is displaced at a first side of a memory array and a high voltage circuit is displaced at an opposite side of the memory array. At least one word line connects the row decoder driver circuit to the high voltage circuit with a blocking transistor, coupled to the row decoder driver circuit configured to prevent a high voltage from reaching said row decoder driver circuit. At least one source line is connected to the high voltage circuit and extends in the direction of the row decoder driver circuit but is not connected thereto.

DETAILED DESCRIPTION OF THE PREFERRED EMBODIMENT

Figure 1:
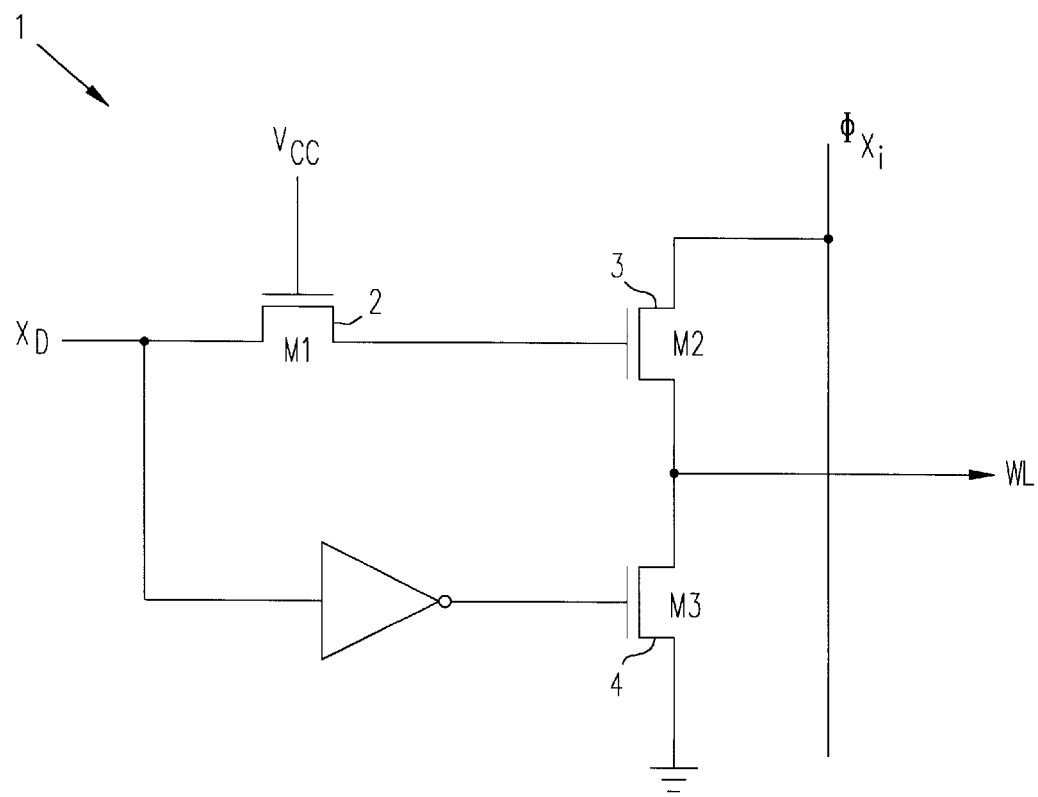
FIG. 1 is a circuit representation of a conventional row decoder driver circuit.
Figure 2:
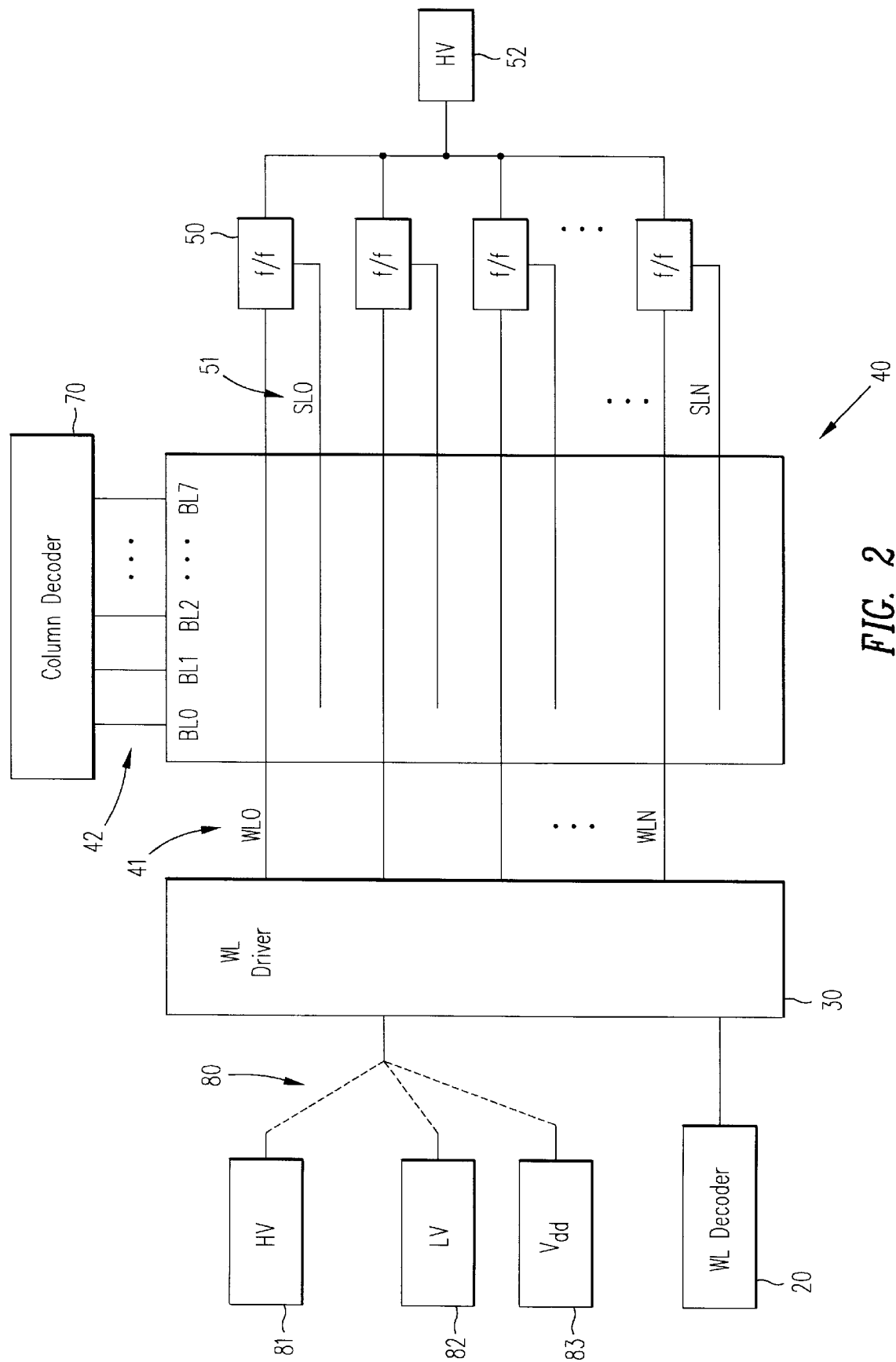
FIG. 2 is a schematic representation of one embodiment of the row decoder driver circuit of the present invention.

FIG. 2 illustrates a first embodiment of the row decoder driver circuit 10 of the present invention. The word decoder 20 and the word line driver 30 are located on one side of a memory array 40. To the opposite side of the memory array 40 is located a source line driver 50 and a high voltage source 52. The source line driver 50 is connected to the high voltage source 52. In operation, the circuitry in the SL driver 50 is connected to the high voltage source 52 and would also be a source of high voltage.

Regarding the memory array 40, a plurality of word lines 41 (WL0–WL7) are horizontally disposed throughout the memory array 40. Furthermore, a plurality of bit lines 42 (BL0–BL7) are vertically disposed throughout the memory array 40. Word lines 41 and bit lines 42 thereby form a "net" throughout the memory array 40. A plurality of memory cells (not shown) are connected to respective areas of this "net." In the preferred embodiment, the memory cells are non-volatile memory cell of the type disclosed in U.S. Pat. No. 5,242,848, which is incorporated herein by reference.

Furthermore, the word lines 41 are connected to the word line driver 30 and extend from the word line driver 30 to the source line driver 50, and are connected thereto. A plurality of source lines 51 are connected to the source line driver 50, and extend therefrom to the word line driver 30, but are not connected thereto.

The word lines 41 must be capable of providing nominal 3 volt, low (1.8V) voltage and high (12V) voltage to the memory cells (not shown) in the memory array 40 depending on the operation, i.e. read program or erase.

For example, if an erase operation is to be performed, the word lines 41 must provide approximately 12V to the memory cells (not shown) that are to be erased, while the source high voltage lines 51 must provide approximately 0V.

Thus, for flash erase mode, i.e. wherein a block of non-volatile memory cells is erased simultaneously, the block of memory cells selected for erasure will depend upon the selected word lines 41 and source lines 51. Typically all the word lines and source lines in a block are selected.

If a program operation is desired, the word lines 41 will be set to a low voltage, for example 1.8V. The selected bit lines 42 will be set to approximately 0.6V, whereas the unselected bit lines 42 will be set at approximately 3V. The source high voltage lines 51 must provide a high voltage (approximately 11V).

The selection of high voltage and low voltage to the word line 41 is effectuated by a voltage switch 80. Depending upon the operation to be performed, either program or erase, the switch 80 can connect the word lines 41 to a Vdd source 83, or to a low voltage source 82 or to a high voltage source 81, respectively. Thus, the requisite voltage is provided to the memory cells (not shown) by means of the word lines 41 and the operation can be performed.

However, this operation cannot be carried out instantaneously, since the source line driver 50 is latched by the selected word line, the source line driver 50 takes approximately 1 μs to generate the required voltage.

Figure 3A:
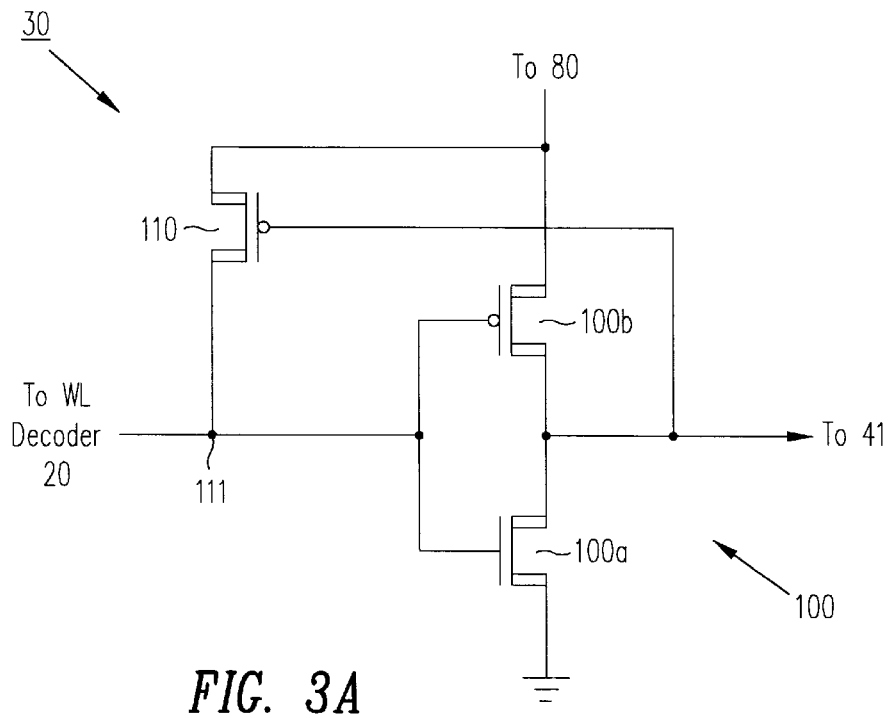
FIG. 3A is a circuit diagram of one embodiment of the row decoder driver circuit of the present invention.

FIG. 3A depicts the word line driver 30 according to one embodiment of the present invention. The word line driver 30 comprises a CMOS inverter 100 and a PMOS high voltage field effect transistor 110. The CMOS inverter 100 comprises an n-type high voltage field effect transistor 100a and a p-type high voltage field effect transistor 100b. The source terminal of the p-type field effect transistor 100b is connected to a voltage source (81 or 82) through a switch 80. The drain terminal of the p-type field effect transistor 100b is connected to the drain terminal of the n-type field effect transistor 100a. The source terminal of the n-type field effect transistor 100a is connected to ground. Each of the gate terminals of the n-type field effect transistor 100a and the p-type field effect transistor 100b are coupled together and connected with the drain terminal of PMOS field effect transistor 110 at a common node 111. Further, the source terminal of the PMOS field effect transistor 110 is connected to the source terminal of the p-type field effect transistor 100b. The gate terminal of the PMOS field effect transistor 110 is coupled to the output of the CMOS inverter 100.

Since transistors 100a, 100b, and 110 can be connected to a source of high voltage 81, they must be capable of supporting such high voltages. Therefore, the transistors 100a, 100b, and 110 are composed of a thick oxide layer and having a long channel length. This large oxide layer and long channel length slows the read operation.

Figure 3B:
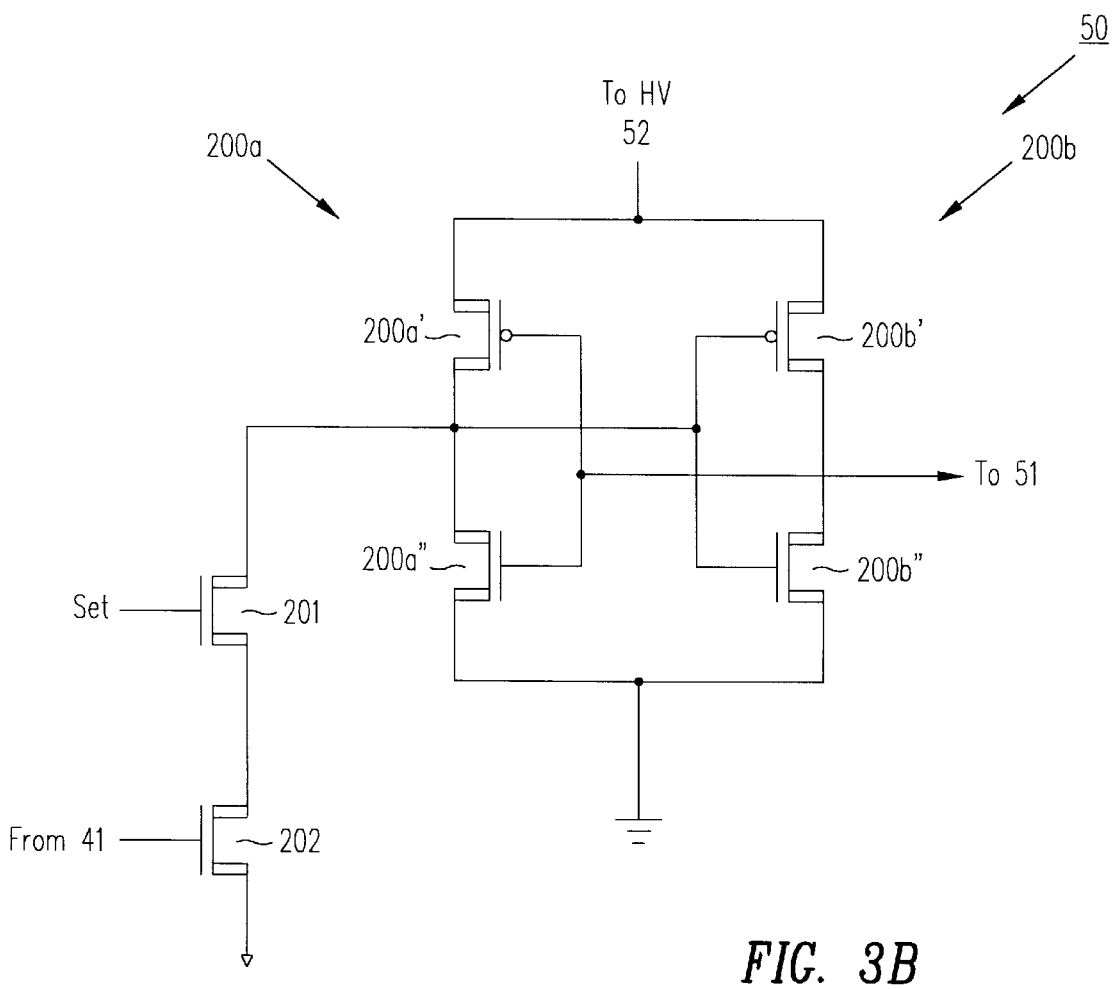
FIG. 3B is a circuit diagram of the CMOS latch coupled to the source high voltage component.

FIG. 3B illustrates the source line driver 50, which is effectively a CMOS latch. The source line driver 50 comprises a first CMOS inverter 200a and a second CMOS inverter 200b. The CMOS inverter 200a comprises a p-type high voltage field effect transistor 200a' and an n-type high voltage field effect transistor 200a". The CMOS inverter 200b comprises a p-type high voltage field effect transistor 200b' and an n-type high voltage field effect transistor 200b".

The source terminals of each of the field effect transistors 200a' and 200b' are coupled together and connected to the high voltage source 52. The source terminals of field effect transistors 200a" and 200b" are coupled together and connected to ground. The gate terminal of n-type high voltage field effect transistor 200a" is connected to the gate terminal of p-type high voltage field effect transistor 200a' and is connected to the source lines 51. Likewise, the gate terminal of n-type high voltage field effect transistor 200b" is connected to the gate terminal of p-type high voltage field effect transistor 200b' and is connected to the drain of a n type high voltage field effect transistor 201, whose gate receives a set signal. The source of the transistor 201 is connected to the drain of a n type high voltage field effect transistor 202, whose gate is connected to the word lines 41. The source of the transistor 202 is connected to ground.

When a particular word line is selected for program operation, it goes to 3V during set time. This sets latch 50 and transistor 200b' connects the source line 51 to the high voltage source 52. Thus, within the selected row of memory cells, all the source lines are at high voltage (about 11 volts) and the selected word line is at about 1.8 volts, during program cycle. The selected memory cell within the selected row line will have its drain at about 0.6 volts, and the unselected memory cell within the selected row line will be at about 3.0 volts.

When a groups of particular word lines is selected for erase, it goes high (i.e. 12 volts). All the memory cells within the selected row lines will then be erased.

Although each of the word lines 41 in the embodiment shown in FIG. 2 is connected to the flip/flops 50, the word lines 41 are not connected to high voltage circuits. In addition, as previously discussed, inverter 100 also has to be made of thick oxide and have long channel lengths in order to be able to handle the high voltages supplied thereto. This has created the problem that high voltage transistors are placed in the same path for high speed read, resulting in an inability to compact the routing of the signal lines associated with the low voltage transistors, and inability to optimize speed.

Figure 4:
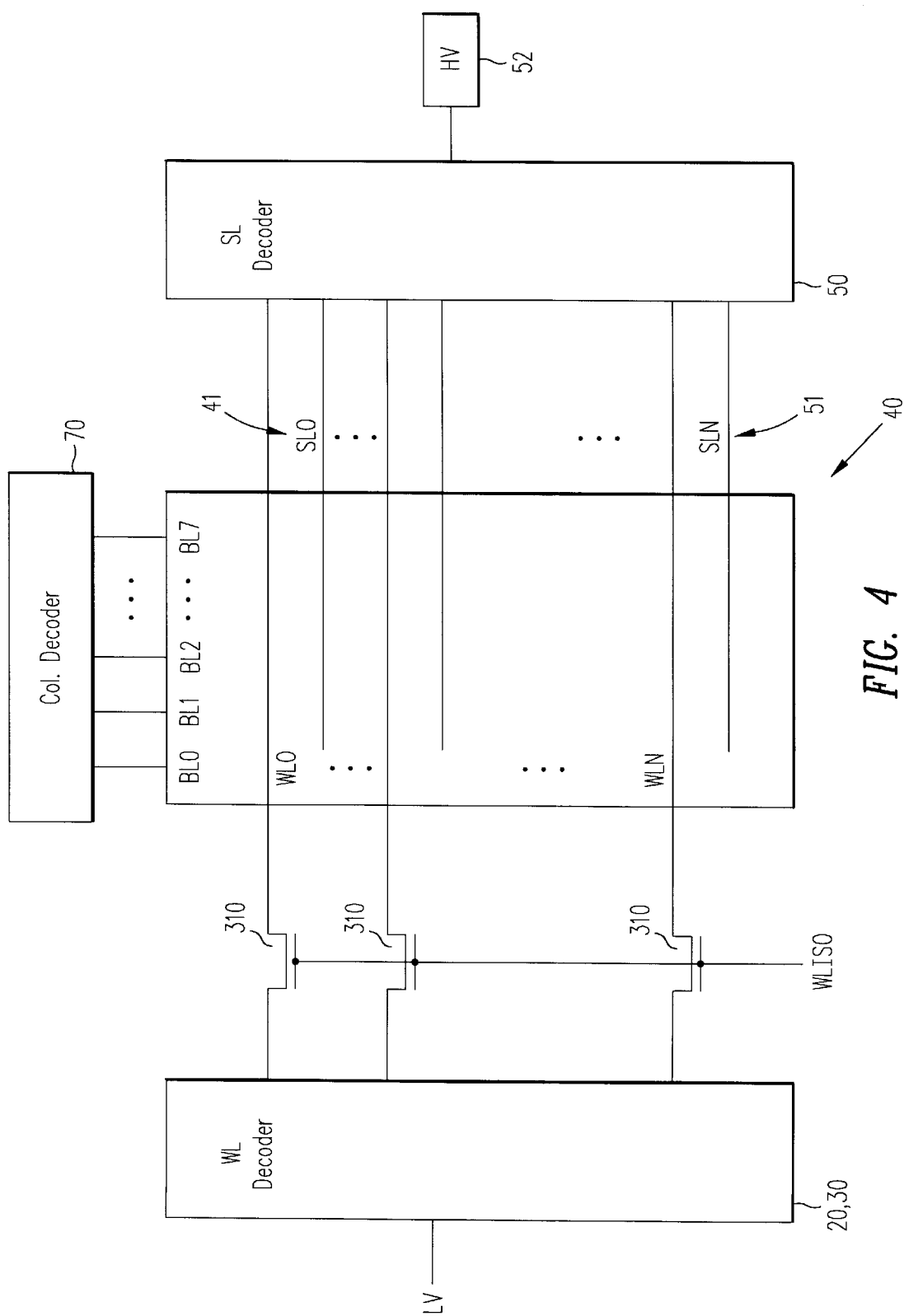
FIG. 4 is a circuit representation of another embodiment of the row decoder driver circuit of the present invention.

In a second embodiment, shown in FIG. 4, this problem is largely solved. The word decoder 20 and the word line driver 30 are located on one side of a memory array 40. To the opposite side of the memory array 40 is located the source high voltage 52 together with latching circuitry 50.

The difference in this embodiment is that the word decoder 20 and word line driver 30 are displaced at a low voltage only section, whereas the source high voltage components 50 and 52 are displaced at a high voltage only section. That is, the high voltage area is separate from the low voltage area. Also, the word lines 41 connect the latching circuitry 50 and the word line decoder 20.

However, within each word line 41 is a blocking field effect transistor 310. The blocking transistor 310 is coupled to the output of the CMOS inverter 30. The blocking transistor 310 may be a native field effect transistor, i.e. zero threshold voltage MOSFET.

Referring still to FIG. 4, the drain terminal of the blocking transistor 310 is connected to the output of the word line decoder driver 30. The source terminal of the blocking transistor 310 is connected to the word lines 41 which extend from the word decoder driver 30 to the source decoder 50. The gate terminal of all the blocking transistors 310 are controlled by WLISO (word line isolation signal).

The source high voltage component 50 comprises a plurality of field effect transistors shown in FIG. 3B. Each of the field effect transistors in the source high voltage component 50 are characterized as thick oxide transistors. That is, they have a thick oxide layer. This is because these transistors must be capable of operating in high voltages. However, these high voltages will be blocked by blocking transistor 310 and will not reach the CMOS inverter 300. In operation, then, when the word line 41 is at a high voltage the blocking transistor 310 is switched OFF to block the high voltage from reaching the decoder 20 and the CMOS inverter 300. Therefore, the high voltage operations and the low voltage operations are separated.

The advantage of this embodiment is that all high voltage transistors (using thick oxides) and all high voltage sources are located on one side of the memory array 40 and one blocking device (transistor) near the word line decoder 20. Therefore, there is less possibility of strong voltages influencing the word line decoder 20 and word line driver 30 circuitry.

Figure 5:
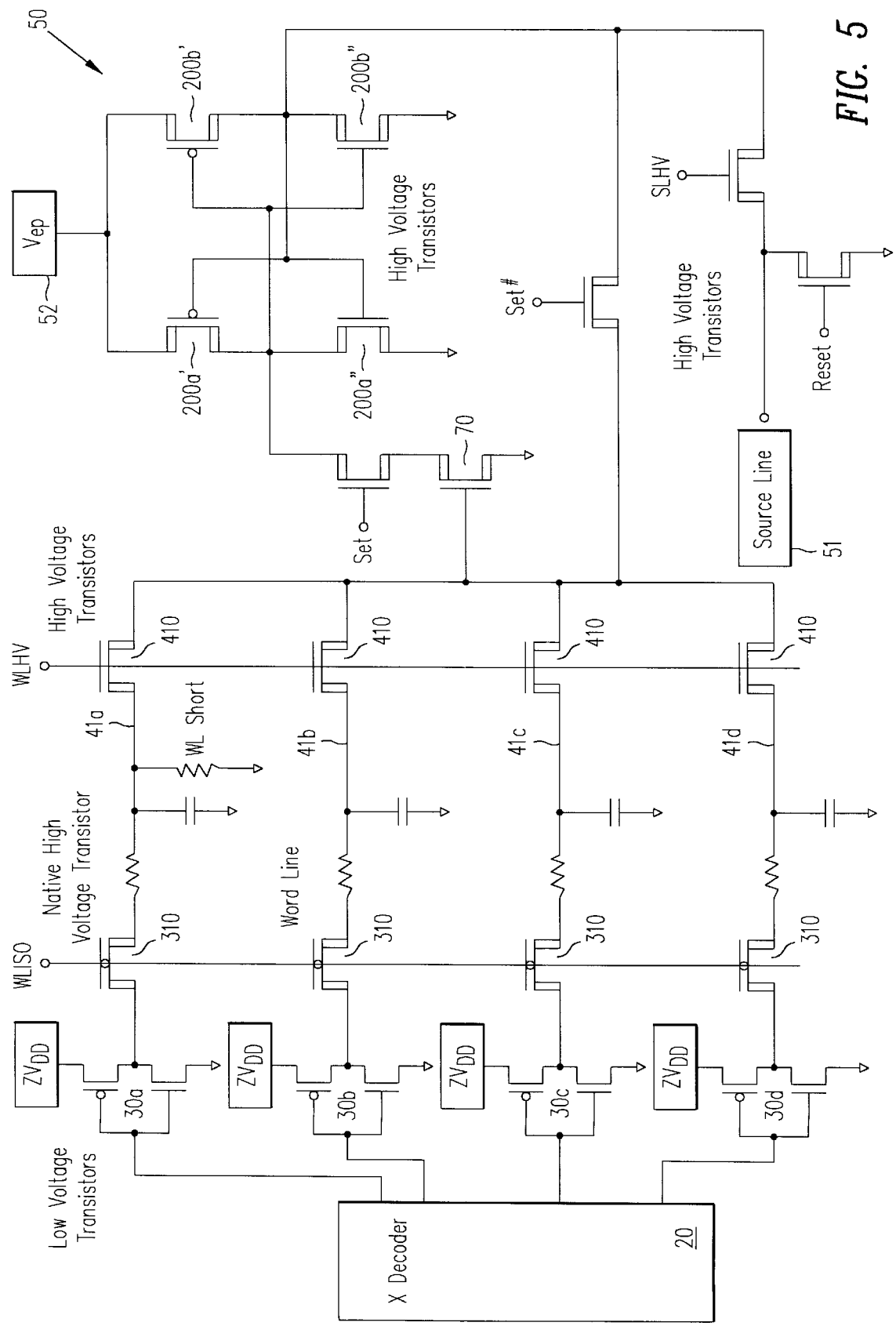
FIG. 5 is a detailed circuit diagram of the embodiment of the row decoder driver circuit shown in FIG. 4.

A further advantage of the embodiment shown in FIG. 4 can be seen by reference to FIG. 5. In FIG. 5, a detailed circuit diagram of a portion of the driver circuit is shown. Four word lines, denoted by 41a, 41b, 41c, and 41d, are shown, and together they form a sector or block which is erased simultaneously in an erase operation. Each word line 41 as shown in FIG. 4 has an associated blocking transistor 310. For explanation of the erase operation, the flip flop 50 is shown as being associated with the group of word lines 41a, 41b, 41c, and 41d.

The problem that the embodiment of the driver circuit shown in FIGS. 4 and 5 can solve relates to a word line short (shown as a short in word line 41a). During chip erase, when voltages are high, a short can cause a considerable drain on the current generating capability of a charge pump. In the prior art, to eliminate the possibility of a short causing high current drain collapsing high voltage, a current limiter circuit has been used.

In the present invention with the use of a flip/flop to select/deselect certain word lines based upon the voltage on the associated word line, a simple circuit detecting a short circuit condition, can cause the deselection of the word lines. Thus, for example, as previously discussed, for erase operation, the word line is at 3 volts. This signal is supplied to the gate of the n-type transistor 70.

A word line voltage in the nature of a pulse is applied to the word lines. If there is no short, in any of the word lines, the 3 volts supplied on the word line will turn on transistor 70. This will cause the drain of the transistor 70 to be at ground. When SET is turned on, a signal generated immediately before the erase operation but after the word line voltage pulse is applied, this would cause the gate of transistor 200b' to be at ground. This turns on transistor 200b' which sets the latch 50.

However, if there is a short, in e.g. word line 41a, the 3 volts supplied on the word line will begin to discharge to ground. This will not turn on transistor 70. When SET is turned on, no voltage will be supplied to the gate of transistor 200b'. Thus, the flip flop 50 will not be set. After setting the flip flop 50, the high voltage (12 volts) from source 52 will be supplied only to those flip flops 50 that have been set. Unselected flip flops 50 cannot supply high voltage from source 52 to the word lines 41.

Finally, another way to cope with word line short is to use current limit (several uamp) on WLHV transistors 410.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

What is claimed is:

1. A word line and source line decoder driver circuit, comprising:

at least one word line;

at least one source line;

a row decoder driver circuit displaced at a first side of a memory array; and a high voltage circuit displaced at an opposite side of said memory array;

wherein said at least one word line is connected to said row decoder driver circuit and extends therefrom in the direction of said high voltage circuit, said at least one source line is connected to said high voltage circuit and extends therefrom in the direction of said row driver circuit, but not connected thereto; and said row decoder driver circuit comprising a switch for connecting to a low voltage source and to a high voltage source.

2. The word line and source line decoder driver circuit of claim 1, wherein said high voltage circuit is configured to maintain said at least one source line at a low voltage state when said row decoder driver circuit maintains said at least one word line at a high voltage state.

3. The word line and source line decoder driver circuit of claim 1, wherein said high voltage circuit is configured to maintain said at least one source line at a high voltage state when said row decoder driver circuit maintains said at least one word line at a low voltage state.

4. The word line and source line decoder driver circuit of claim 1, wherein said row decoder driver circuit comprises an input terminal configured to receive an input signal;

an output terminal configured to convey an output signal;

a logic circuit, coupled between said input terminal and said output terminal, configured to receive said input signal and in accordance therewith convey said output signal; and a field effect transistor coupled to said logic circuit, said field effect transistor configured to sense said output signal, and in accordance therewith, modify said input signal.

5. The word line and source line decoder driver circuit of claim 4, wherein said logic circuit comprises a CMOS inverter circuit.

6. The word line and source line decoder driver circuit of claim 5, wherein said CMOS inverter comprises an n-type field effect transistor and a p-type field effect transistor, each of said n-type field effect transistor and said p-type field effect transistor characterized by a thick oxide layer and a long channel length.

7. The word line and source line decoder driver circuit of claim 4, wherein said field effect transistor comprises a PMOS field effect transistor.

8. The word line and source line decoder driver circuit of claim 1, wherein said row decoder driver circuit comprises an input terminal configured to receive an input signal;

an output terminal, configured to convey an output signal;

a first field effect transistor, the source terminal of said first field effect transistor coupled to a voltage source;

a second field effect transistor, the drain terminal of said second field effect transistor coupled to the drain terminal of said first field effect transistor, the gate terminals of each of said first field effect transistor and said second field effect transistor coupled to said input terminal; and a third field effect transistor, the source terminal of said third field effect transistor coupled to said voltage source, the drain terminal of said third field effect transistor coupled to said input terminal, whereby the drain terminal of said third field effect transistor and the gate terminals of each of said first field effect transistor and said second field effect transistor form a common node, the gate terminal of said third field effect transistor coupled to said output terminal.

9. The word line and source line decoder driver circuit of claim 8, wherein each of said first field effect transistor and said second field effect transistor characterized by a thick oxide layer and a long channel length.

10. The word line and source line decoder driver circuit of claim 1, wherein said source high voltage circuit comprises an input terminal configured to receive an input signal;

an output terminal configured to convey an output signal; and a latching circuit coupled between said input terminal and said output terminal, said latching circuit configured to receive said input signal and in accordance therewith convey said output signal, wherein said output signal is a complementary state of said input signal.

11. The word line and source line decoder driver circuit of claim 10, wherein said latching circuit comprises a CMOS latch.

12. The word line and source line decoder driver circuit of claim 1, wherein said high voltage circuit comprises an input terminal configured to receive an input signal;

an output terminal configured to convey an output signal;

a first field effect transistor, the source terminal of said first field effect transistor coupled to a voltage source;

a second field effect transistor, the drain terminal of said second field effect transistor coupled to the drain terminal of said first field effect transistor, the source terminal of said second field effect transistor coupled to a grounded line;

a third field effect transistor, the source terminal of said third field effect transistor coupled to said voltage source, whereby the source terminals of each of said first field effect transistor and said third field effect transistor are coupled together to form a first common node; and a fourth field effect transistor, the drain terminal of said fourth field effect transistor coupled to the drain terminal of said third field effect transistor, the source terminal of said fourth field effect transistor coupled to said grounded line, whereby the source terminals of each of said second field effect transistor and said fourth field effect transistor are coupled together to form a second common node, wherein the gate terminals of each of said first field effect transistor and said second field effect transistor are coupled to said output terminal and the gate terminals of each of said third field effect transistor and said fourth field effect transistor are coupled to said input terminal.

13. The word line and source line decoder driver circuit of claim 12, wherein said first field effect transistor and said second field effect transistor comprises a first CMOS inverter and wherein said third field effect transistor and said fourth field effect transistor comprises a second CMOS inverter.

14. A word line decoder driver circuit for use with a memory array, comprising:

a row decoder driver circuit displaced at a first side of the memory array;

a high voltage circuit displaced at a second side, opposite said first side of the memory array;

at least one word line connecting to said row decoder driver circuit and extending therefrom in the direction of said high voltage circuit, and connecting thereto;

a blocking transistor, in each word line, configured to prevent a high voltage from reaching said row decoder driver circuit.

15. The word decoder driver circuit of claim 14, wherein said blocking transistor comprises a zero threshold field effect transistor.

16. The word line decoder driver circuit of claim 14, wherein said high voltage circuit comprises a plurality of field effect transistors, wherein each of said plurality of field effect transistors are characterized by a thick gate oxide layer.

17. The word line decoder driver circuit of claim 16 wherein said memory array comprising a plurality of word lines, a plurality of source lines, and a plurality of bit lines forming an array.

18. The word line decoder driver circuit of claim 17 wherein said plurality of field effect transistors form a latch with said at least one word line connected to said latch, as an input thereof, and with an output of said latch connected to a source line.

19. The word line decoder driver circuit of claim 18 further comprising:

a first transistor connected to said latch at said input thereof, said first transistor having a first and second terminals and a gate for controlling the flow of current between said first and second terminals;

said gate of said first transistor connected to said at least one word line;

said first terminal of said first transistor connected to a first voltage; and said second terminal of said first transistor coupled to said input of said latch.

20. The word line decoder driver circuit of claim 19 wherein said latch being connected to a second voltage source, and said output is connected to said second voltage source when said input is a high signal.

* * * * *